(12) United States Patent
Posseme et al.

(10) Patent No.: US 11,362,181 B2
(45) Date of Patent: Jun. 14, 2022

(54) METHOD FOR MANUFACTURING AN ELECTRONIC COMPONENT HAVING MULTIPLE QUANTUM DOTS

(71) Applicant: Commissariat A L'Energie Atomique et aux Energies Alternatives, Paris (FR)

(72) Inventors: Nicolas Posseme, Grenoble (FR); Louis Hutin, Grenoble (FR); Cyrille Le Royer, Grenoble (FR); Fabrice Nemouchi, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/699,384

(22) Filed: Nov. 29, 2019

(65) Prior Publication Data

US 2020/0185497 A1    Jun. 11, 2020

(30) Foreign Application Priority Data

Dec. 2, 2018  (FR) ..................... 18 72199

(51) Int. Cl.
*H01L 29/12*  (2006.01)
*H01L 29/417*  (2006.01)
(Continued)

(52) U.S. Cl.
CPC ...... *H01L 29/127* (2013.01); *H01L 29/41775* (2013.01); *H03K 17/567* (2013.01); *H01L 29/4236* (2013.01)

(58) Field of Classification Search
CPC ..... H01L 31/035218; H01L 31/035209; H01L 31/035227; H01L 31/035236
See application file for complete search history.

(56) References Cited

U.S. PATENT DOCUMENTS

2008/0143421 A1   6/2008  Yanagihara et al.
2015/0179643 A1   6/2015  Curatola et al.
(Continued)

FOREIGN PATENT DOCUMENTS

JP      2015-122544 A     7/2015

OTHER PUBLICATIONS

Uchida et al., "Fabrication and evaluation of series-triple quantum dots by thermal oxidation of silicon nanowire", Nov. 20, 2015 (Year: 2015).*

(Continued)

*Primary Examiner* — Julio J Maldonado
*Assistant Examiner* — Mohammad A Rahman
(74) *Attorney, Agent, or Firm* — Oblon, McClelland, Maier & Neustadt, L.L.P.

(57) ABSTRACT

A process for fabricating an electronic component with multiple quantum dots is provided, including providing a stack including a substrate, a nanostructure made of semiconductor material superposed over the substrate and including first and second quantum dots and a link linking the quantum dots, first and second control gate stacks arranged on the quantum dots, the gate stacks separated by a gap, the quantum dots and the link having a same thickness; partially thinning the link while using the gate stacks as masks to obtain the link, a thickness of which is less than that of the quantum dots; and conformally forming a dielectric layer on either side of the gate stacks so as to fill the gap above the partially thinned link. An electronic component with multiple quantum dots is also provided.

16 Claims, 8 Drawing Sheets

(51) Int. Cl.
*H01L 29/423* (2006.01)
*H03K 17/567* (2006.01)

(56) References Cited

U.S. PATENT DOCUMENTS

| | | | | |
|---|---|---|---|---|
| 2016/0322479 | A1* | 11/2016 | Liu | H01L 29/516 |
| 2018/0061988 | A1* | 3/2018 | Huang | H01L 29/66666 |
| 2018/0097095 | A1* | 4/2018 | Barraud | H01L 29/0895 |
| 2019/0367861 | A1* | 12/2019 | Swoboda | C12M 25/02 |

OTHER PUBLICATIONS

French Search Report dated May 22, 2019 in French Patent Application No. 1871019, 11 pages.

* cited by examiner

[Fig. 1]
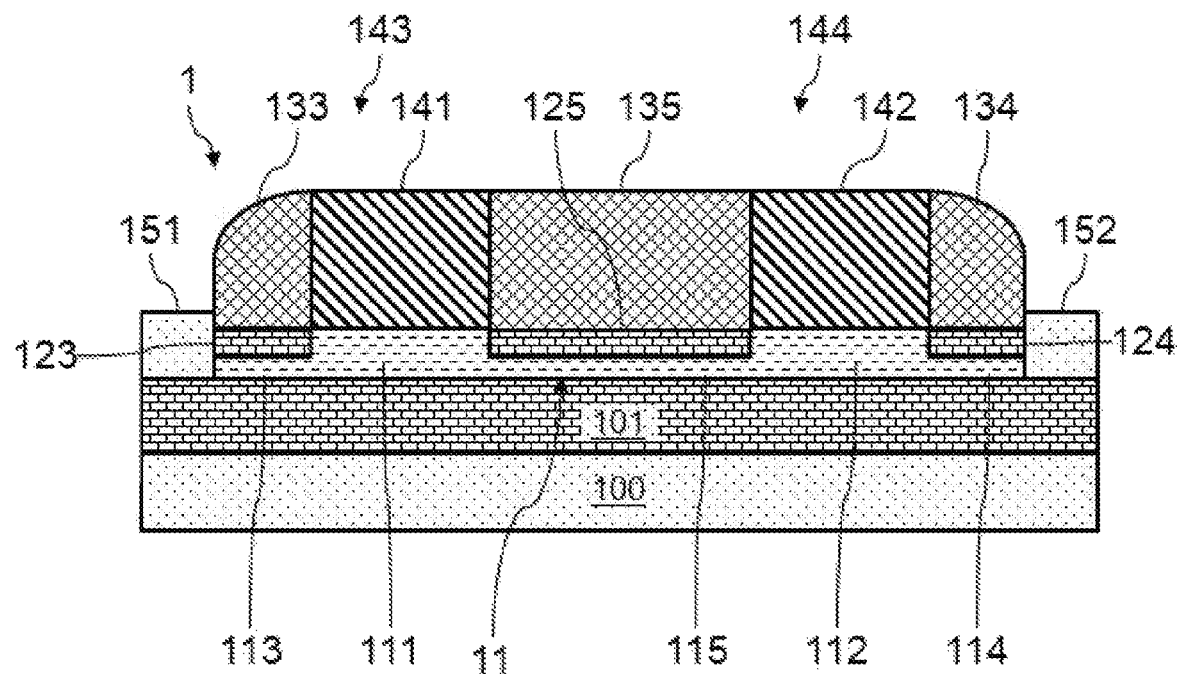
[Fig. 2]
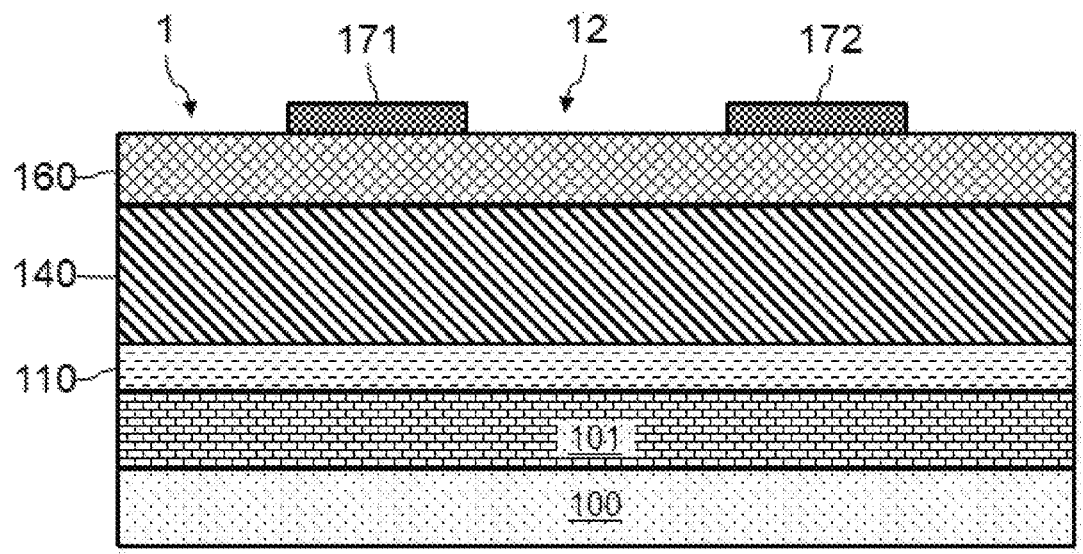

[Fig. 3]
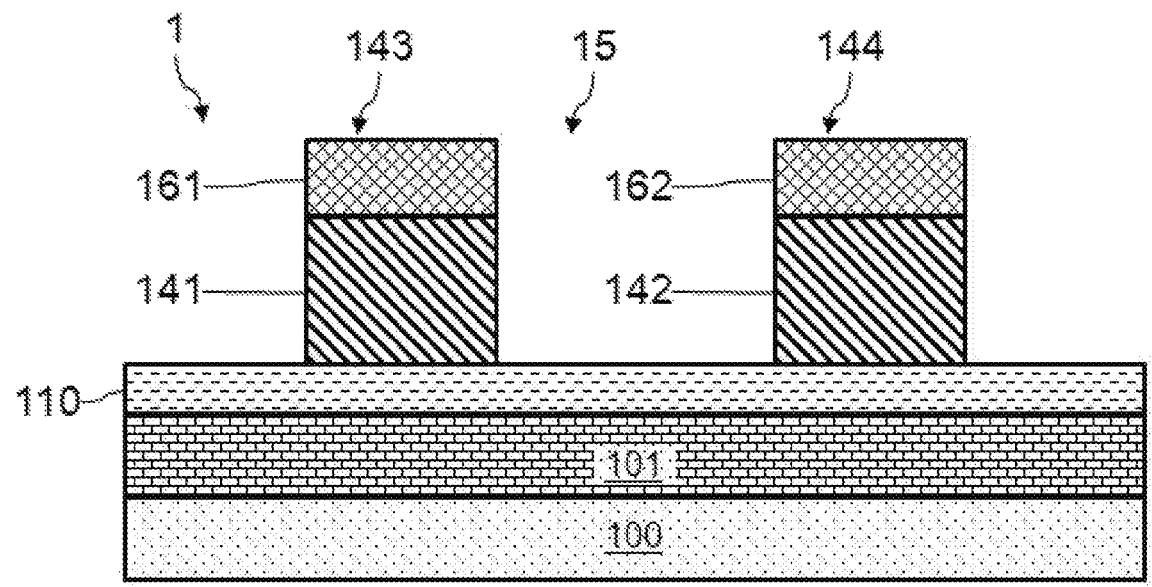
[Fig. 4]
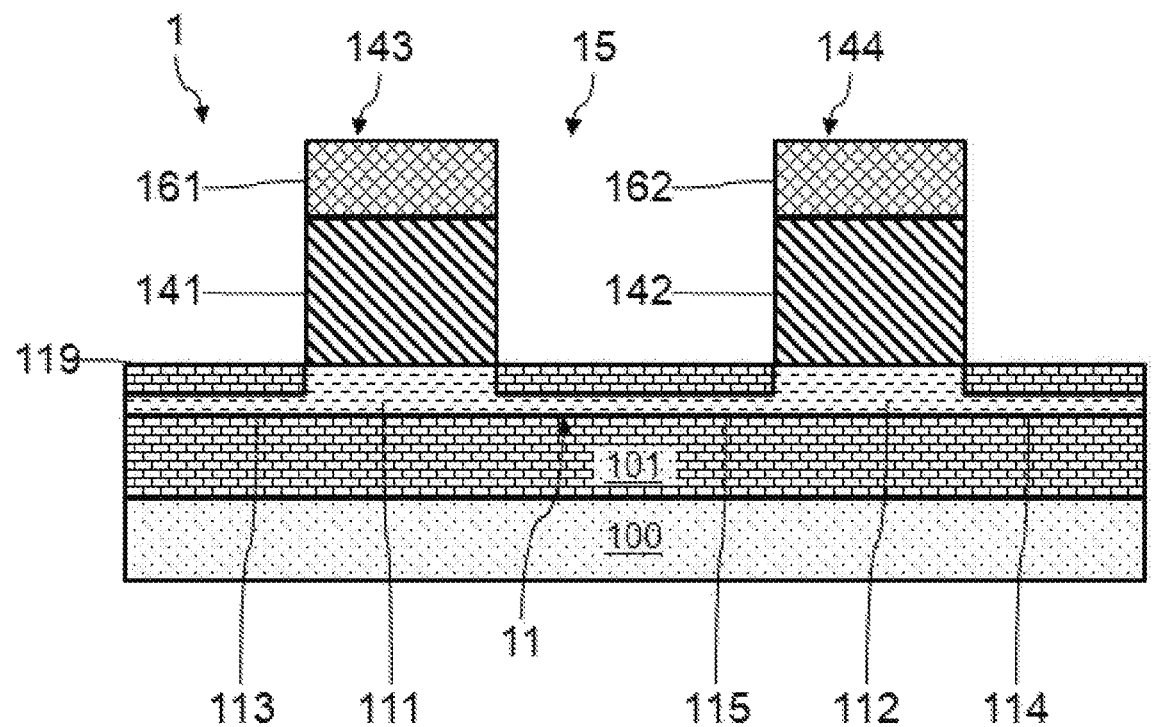

[Fig. 5]
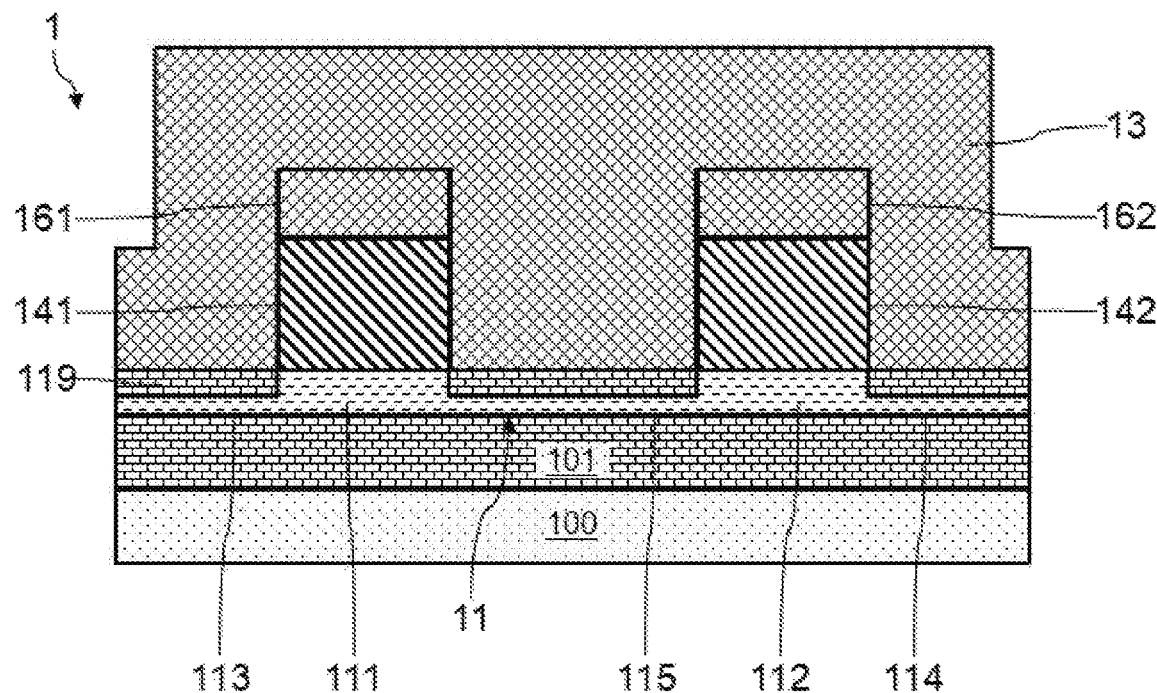
[Fig. 6]
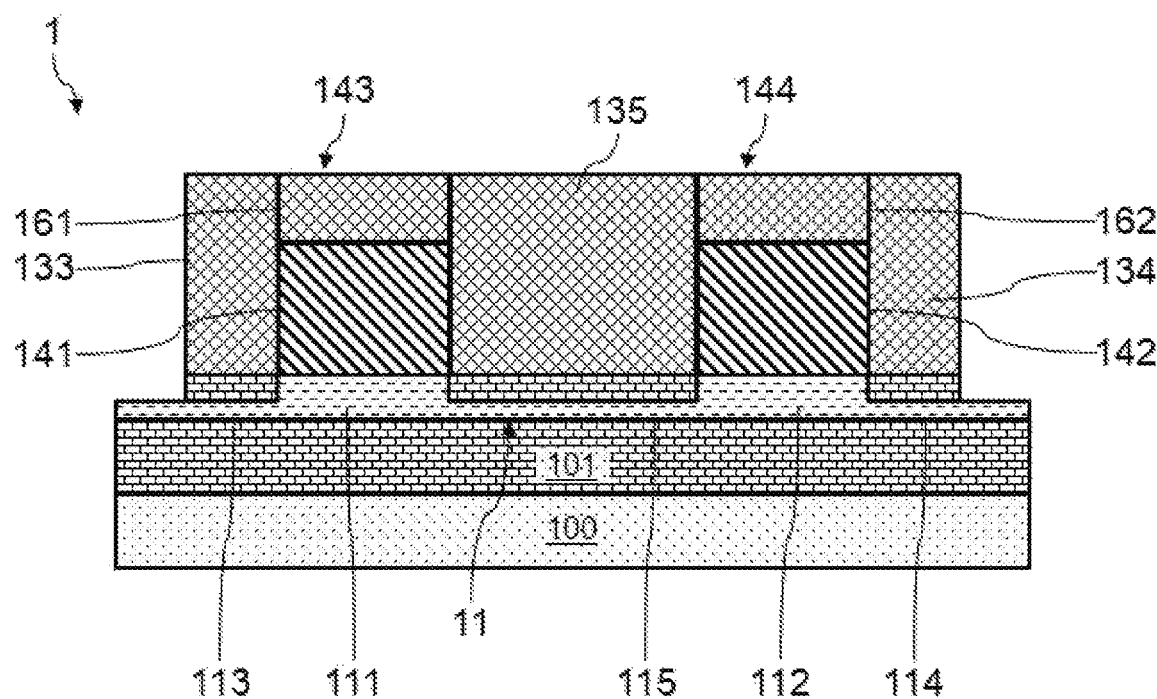

[Fig. 7]
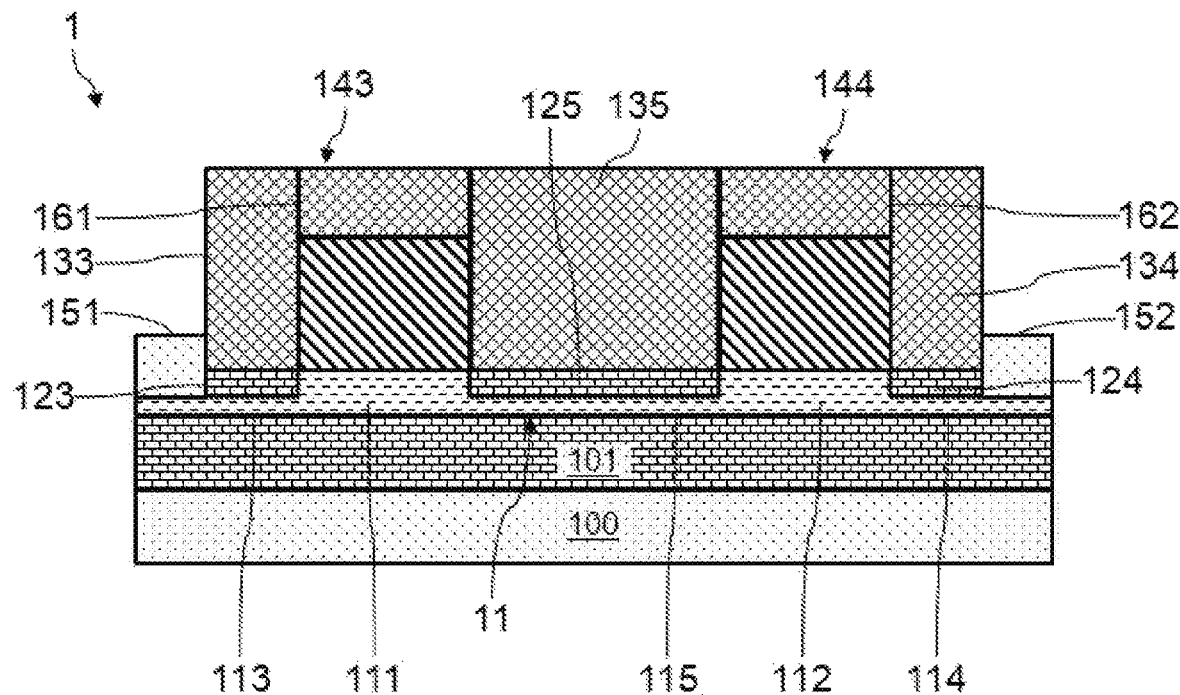
[Fig. 8]
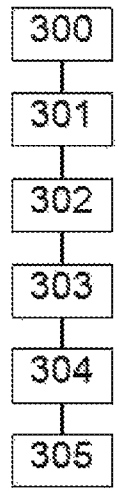

[Fig. 9]
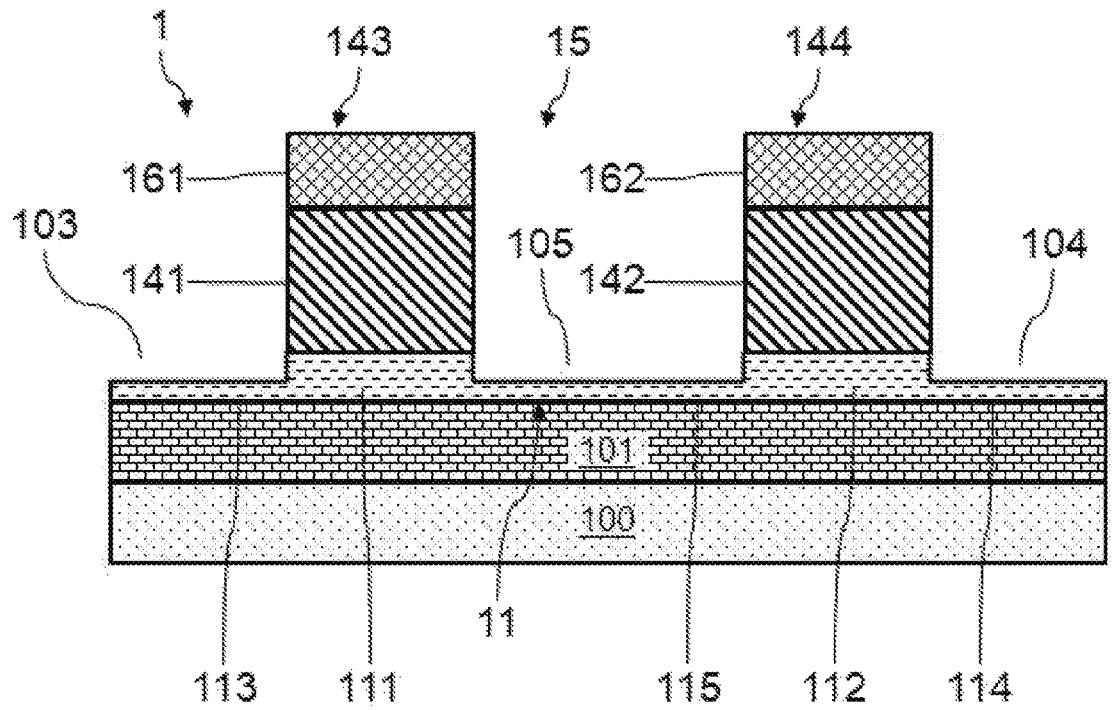
[Fig. 10]
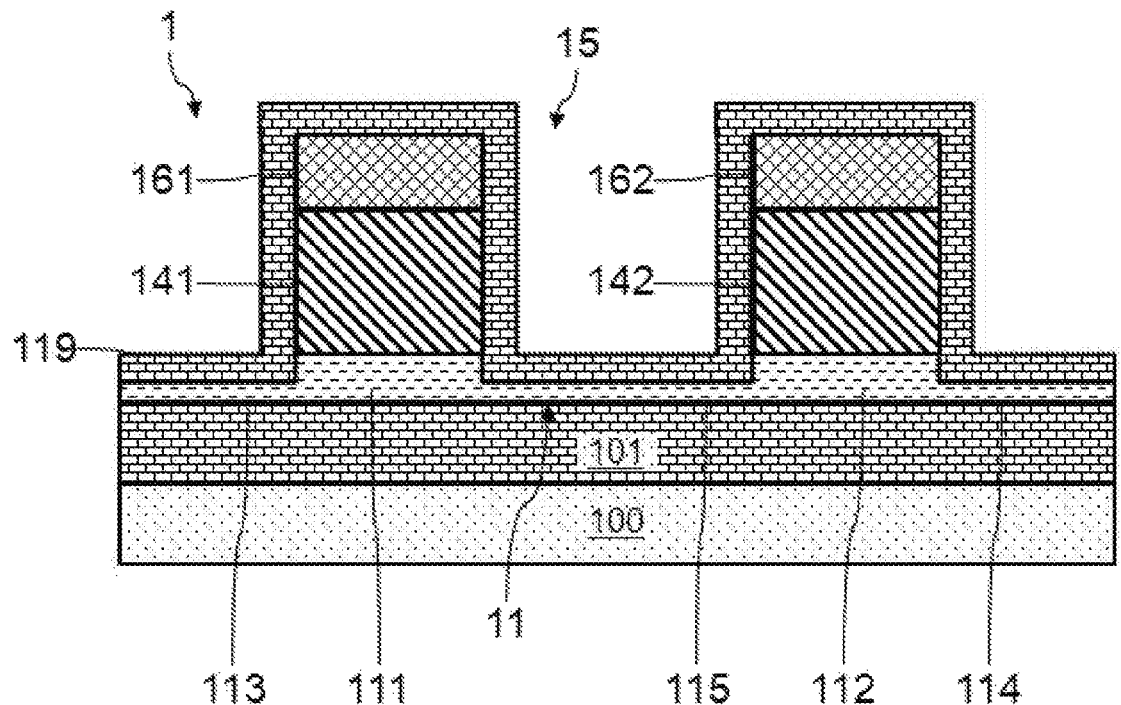

[Fig. 11]
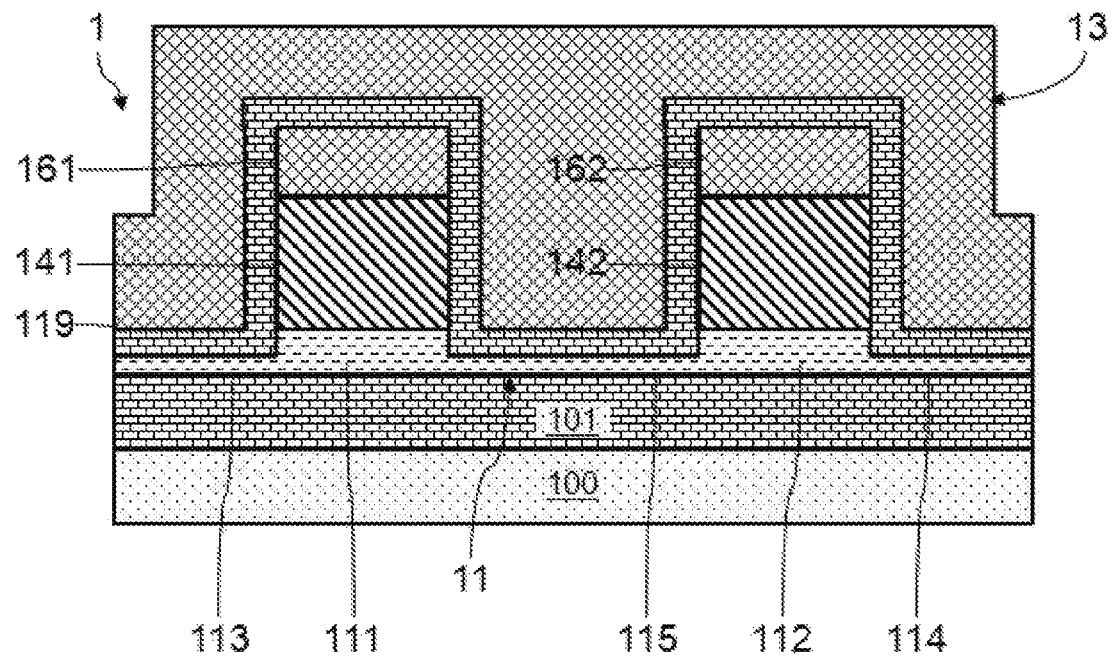
[Fig. 12]
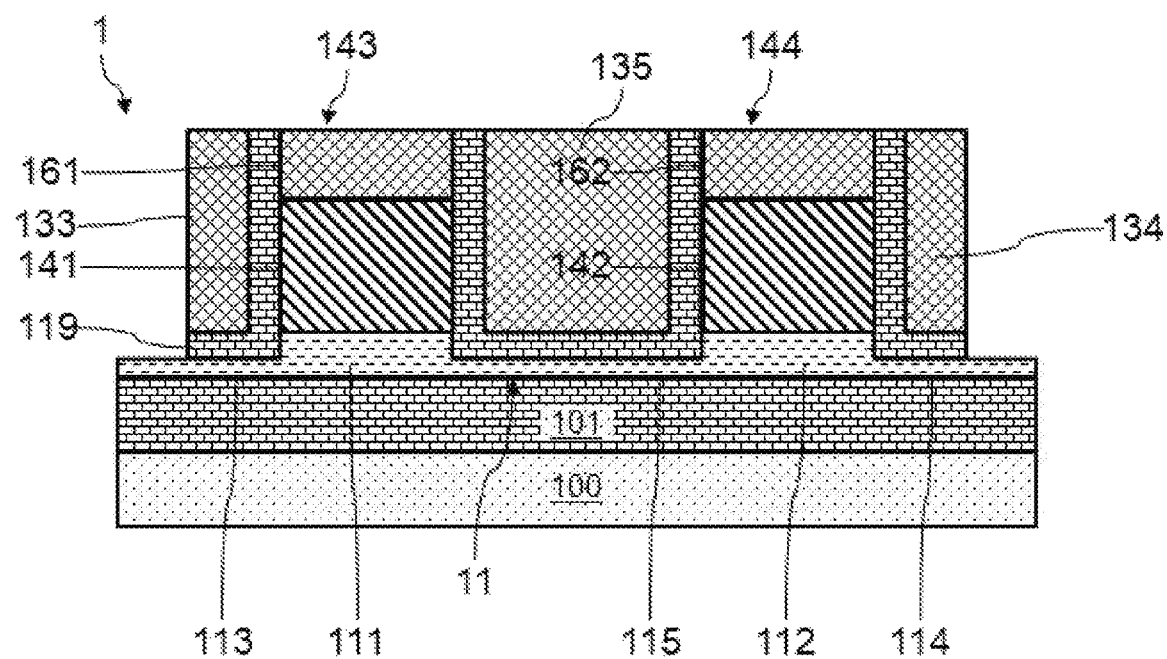

[Fig. 13]
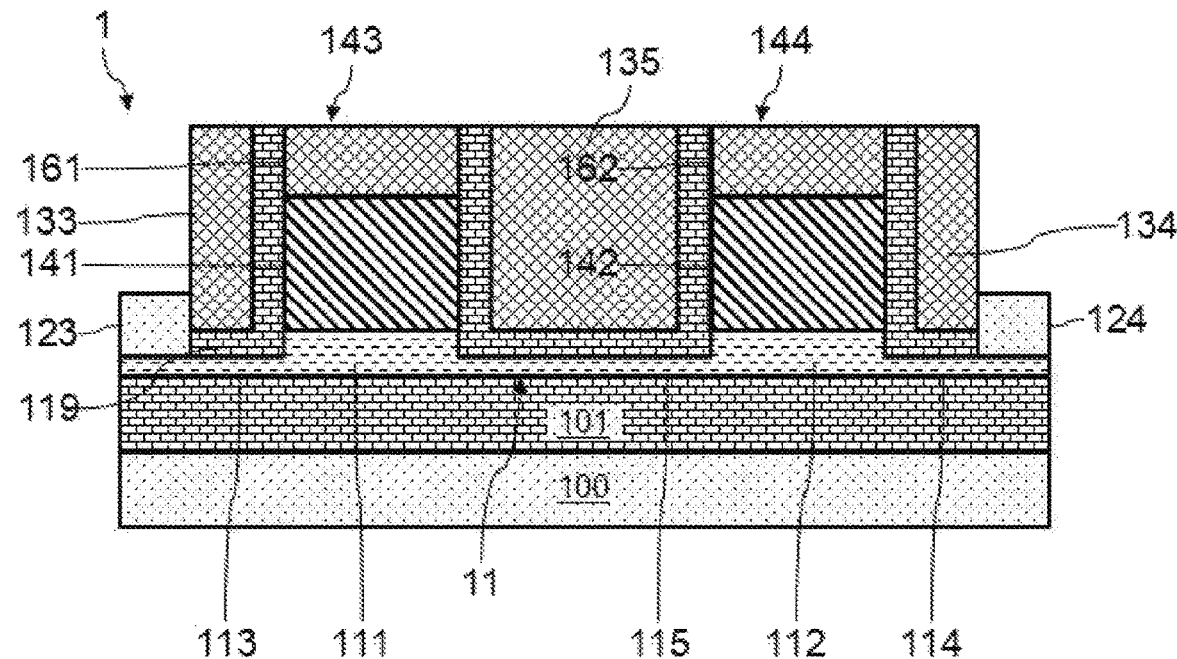
[Fig. 14]
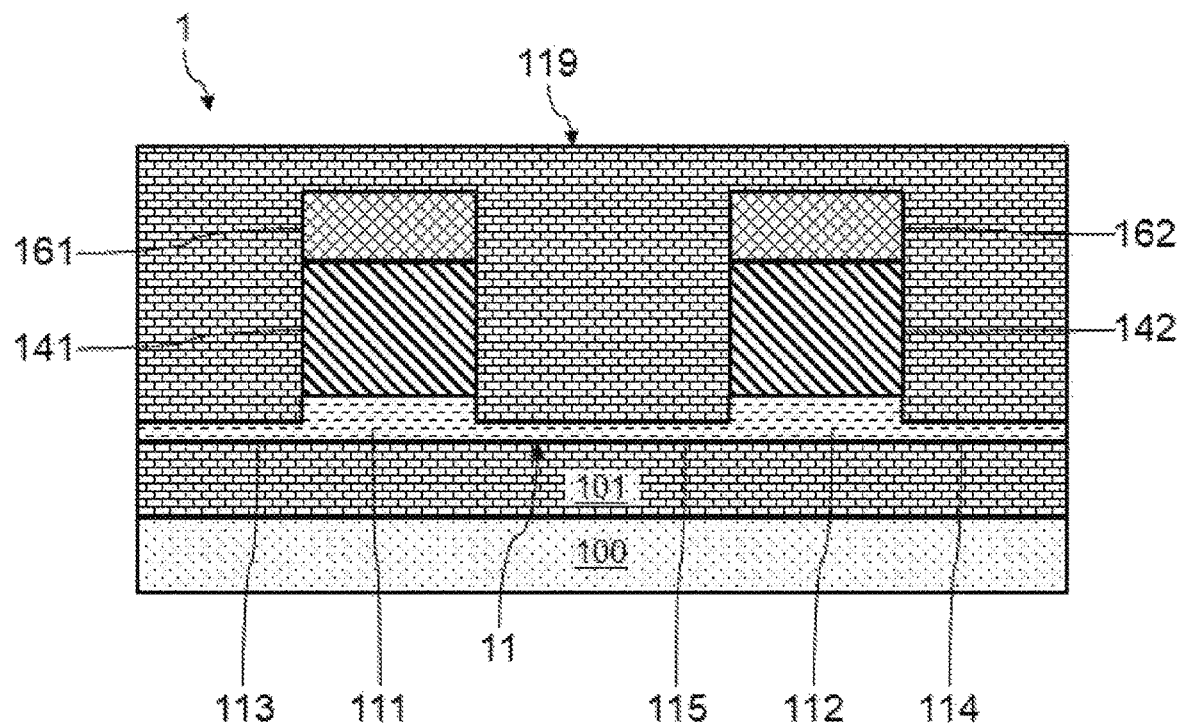

[Fig. 15]
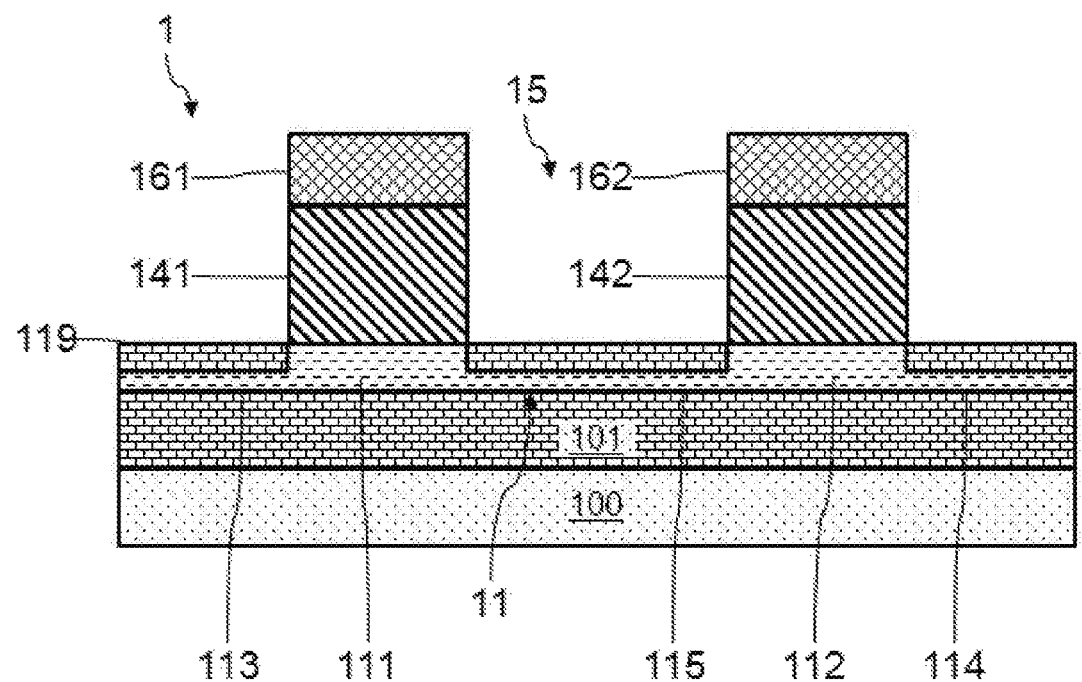

METHOD FOR MANUFACTURING AN ELECTRONIC COMPONENT HAVING MULTIPLE QUANTUM DOTS

The invention relates to the field of spintronics, and notably to electronic components with multiple quantum dots or bits coupled together, together with the processes for their fabrication.

Quantum electronics provides a basis for improvements in performance. By analogy with conventional electronics, the quantum bit represents the basic calculation element for quantum electronics. In conventional electronics, Boolean calculations are carried out based on bits having one state from between two possible states. A quantum bit is a superposition of the eigen states |0> and |1>.

Quantum dots are used as basic elements in quantum electronics. Quantum dots use semiconductor nanostructures to form potential wells for confining electrons or holes in the three dimensions of space. The quantum information is then coded in purely quantum degrees of freedom: in this case the spin ½ of the electron. The aim of quantum dots is to isolate one or more charge carriers for defining a qubit based on their spin. By taking advantage of the quantum phenomena of superposition and entanglement, certain algorithms then allow a polynomial, or even an exponential, improvement in calculation time with respect to their homologues based on binary logic. According to one approach, electrons are confined by field effect under gates of transistors, and the information is encoded in the spin of these electrons.

In order to perform quantum logic operations, it is important to be able:
- to manipulate the quantum state of the qubits;
- to detect a change in the quantum states of the qubits;
- to make the qubits communicate with one another via adjustable quantum coupling.

In order to make adjacent qubits communicate using an adjustable coupling mechanism, one known solution is to adjust the Coulomb potential barrier between these adjacent qubits.

According to some designs, the control of a qubit is provided via a primary gate positioned directly above the qubit, the modulation of the potential barrier being provided by a secondary gate positioned directly above the gap between two adjacent qubits.

In order to ensure coupling between adjacent qubits, it may be important for these qubits to be very close together, which may impose a spacing of less than 100 nm between the primary gates of these qubits.

Additionally, the coupling between two adjacent qubits is optimal with increased tunnelling resistance between the two qubits. Adjacent qubits are generally formed in the same silicon nanowire, the silicon nanowire then running between the qubits to form tunnelling resistance. The nanowire also runs from a first qubit to a first carrier reservoir and from another qubit to a second carrier reservoir. Increasing the tunnelling resistance is industrially difficult to achieve based on the nanowire thickness used for qubits.

The invention aims to overcome one or more of these drawbacks. Thus, the invention relates to a process for fabricating an electronic component with multiple quantum dots such as defined in the appended claims. The invention also relates to an electronic component with multiple quantum dots such as defined in the appended claims.

A person skilled in the art will understand that each of the features in a dependent claim or in the description may be independently combined with the features of an independent claim without, however, constituting an intermediate generalization.

Other features and advantages of the invention will become clearly apparent from the description thereof that is given hereinafter, by way of indication and without any limitation, with reference to the appended drawings, in which:

FIG. 1 is a schematic sectional view of an example of a circuit with quantum dots obtained using a fabrication process according to the invention;

FIG. 2 is a schematic sectional view of the circuit with quantum dots of FIG. 1 at a step in the fabrication process according to one example of a first embodiment;

FIG. 3 is a schematic sectional view of the circuit with quantum dots of FIG. 1 at a step in the fabrication process according to one example of the first embodiment;

FIG. 4 is a schematic sectional view of the circuit with quantum dots of FIG. 1 at a step in the fabrication process according to one example of the first embodiment;

FIG. 5 is a schematic sectional view of the circuit with quantum dots of FIG. 1 at a step in the fabrication process according to one example of the first embodiment;

FIG. 6 is a schematic sectional view of the circuit with quantum dots of FIG. 1 at a step in the fabrication process according to one example of the first embodiment;

FIG. 7 is a schematic sectional view of the circuit with quantum dots of FIG. 1 at a step in the fabrication process according to one example of the first embodiment;

FIG. 8 is a diagram summarizing the steps implemented in this fabrication process;

FIG. 9 is a schematic sectional view of the circuit with quantum dots of FIG. 1 at a step in the fabrication process according to one example of a second embodiment;

FIG. 10 is a schematic sectional view of the circuit with quantum dots of FIG. 1 at a step in the fabrication process according to one example of the second embodiment;

FIG. 11 is a schematic sectional view of the circuit with quantum dots of FIG. 1 at a step in the fabrication process according to one example of the second embodiment;

FIG. 12 is a schematic sectional view of the circuit with quantum dots of FIG. 1 at a step in the fabrication process according to one example of the second embodiment;

FIG. 13 is a schematic sectional view of the circuit with quantum dots of FIG. 1 at a step in the fabrication process according to one example of the second embodiment;

FIG. 14 is a schematic sectional view of the circuit with quantum dots of FIG. 1 at a step in the fabrication process according to one example of a third embodiment; and FIG. 15 is a schematic sectional view of the circuit with quantum dots of FIG. 1 at a step in the fabrication process according to one example of the third embodiment.

FIG. 1 is a sectional view of an example of a circuit 1 with multiple quantum dots obtained using a fabrication process according to the invention. The circuit 1 includes a substrate 100 made of semiconductor material. The substrate 100 is here covered with a buried dielectric layer 101. A nanostructure 11 made of semiconductor material is deposited on top of the dielectric layer 101. The nanostructure 11 here takes the form of a nanowire. The semiconductor material of the nanostructure 11 is for example a semiconductor that is not intentionally doped. The material of the nanostructure 11 is for example silicon.

The nanostructure 11 comprises quantum dots 111 and 112. The quantum dots 111 and 112 form qubit confinement regions. The width of the quantum dots 111 and 112 may for example be between 5 and 40 nm. The thickness of the quantum dots 111 and 112 may for example be between 5 and 20 nm. The quantum dots 111 and 112 are coupled. The nanostructure 11 thus comprises a link 115 linking the quantum dots 111 and 112. The link 115 couples the quantum dots 111 and 112 by tunnelling. The quantum dots 111 and 112 may typically be separated by a distance of between 20 and 120 nm. Such a distance typically corresponds to electrostatic quantum dots. In order to exhibit a relatively high electrical resistance, the thickness of the link 115 may advantageously be between 2 and 10 nm, typically 3 nm.

The circuit advantageously comprises carrier reservoirs 151 and 152 that are arranged on either side of the nanostructure 11. The carrier reservoirs 151 and 152 are here made of semiconductor material. The carrier reservoirs 151 and 152 make electrical contact with respective ends of the nanostructure 11 (here via vertical faces of the ends of the nanostructure 11. According to one variant, the carrier reservoirs 151 and 152 may be positioned on top of first and second ends of the nanostructure 11). The nanostructure 11 comprises a link 113, via which the carrier reservoir 151 makes contact with the quantum dot 111 by tunnelling. The nanostructure 11 comprises a link 114, via which the carrier reservoir 152 makes contact with the quantum dot 112 by tunnelling. The thickness of the links 113 and 114 is advantageously between 2 and 10 nm, typically 3 nm.

A control gate stack 143 is arranged on top of the quantum dot 111. The control gate stack 143 includes here a control gate 141 and a gate insulator (not illustrated). The control gate 141 is for example made of doped polysilicon. The control gate stack 143 is vertically aligned with the quantum dot 111. A control gate stack 144 is arranged on top of the quantum dot 112. The control gate stack 144 includes here a control gate 142 and a gate insulator (not illustrated). The control gate 142 is for example made of doped polysilicon. The control gate stack 144 is vertically aligned with the quantum dot 112.

The link 115 is covered by a dielectric layer 125. The dielectric layer 125 is for example formed of $SiO_2$. The dielectric layer 125 is covered by a spacer 135. The spacer 135 is for example made of SiN. The spacer 135 fills the gap between the stacks 143 and 144. The spacer 135 runs between the gate stacks 143 and 144. The links 113 and 114 are covered by dielectric layers 123 and 124, respectively. The dielectric layers 123 and 124 are for example formed of $SiO_2$. The dielectric layers 123 and 124 are covered by spacers 133 and 134, respectively. A dielectric layer is thus deposited on either side of the gate stacks 143 and 144 and fills the gap between these stacks. The spacer 135 is here obtained by conformally depositing dielectric material.

The thickness of the dielectric layer 101 may, for example, be between 10 and 50 nm. By biasing the substrate 100 appropriately, it is possible to adjust the coupling between the quantum dots 111 and 112. The substrate 100 may then be used as a back gate. It is thus possible to adjust the Coulomb potential barrier located between these two quantum dots 111 and 112. The back gate makes it possible in particular to regulate the degree of coupling between the two adjacent quantum dots 111 and 112 by adjusting the tunnelling barrier separating them. Depending on the polarity applied to the back gate formed, the tunnelling barrier may be weakened (strong coupling) or strengthened (week coupling, high level of confinement), with minimal coupling with respect to the other tunnel junctions or control gates of the quantum dots 111 and 112.

The substrate 100 may be locally doped, with a level of doping that is advantageously at least equal to $10^{19}$ $cm^{-3}$, to form a back gate. The substrate 100 may for example be doped by means of ion implantation, for example before a step of depositing a layer forming the nanostructure 110 on top of the insulating layer 101.

FIGS. 2 to 7 are sectional and top views of a component 1 with multiple quantum dots at various steps in one example of a first embodiment of a fabrication process according to the invention. FIG. 8 is a diagram summarizing the steps implemented in this process. A description of steps 300 and 301 is provided by way of illustration but the steps are known per se to a person skilled in the art and may be carried out differently.

In this particular case, the presence of a layer 119 of $SiO_2$ on the link 115 makes it possible to obtain very high interface quality at the link 115, and thus to decrease noise and/or interference for the qubits of the quantum dots 111 and 112.

In FIG. 2, step 300 is implemented. Here, a semiconductor-on-insulator substrate is provided beforehand. A nanostructure 110 (for example silicon that is not intentionally doped) is thus deposited on top of a dielectric layer 101, which is typically made of $SiO_2$. The dielectric layer 101 is here formed on top of a semiconductor substrate 100, typically made of silicon that is not intentionally doped. The nano structure 110 is here covered by a layer of gate material 140. The layer of gate material 140 is for example polysilicon. A layer of gate dielectric (not illustrated) is advantageously placed between the layer 140 and the nanostructure 110. The layer of gate material 140 is here covered by a hardmask layer 160. The hardmask layer 160 is for example made of SiN or of $SiO_2$. Masks 171 and 172 made of hardened resist are positioned on top of the hardmask layer 160. The masks 171 and 172 are separated by a groove 12. The masks 171 and 172 are typically produced using photolithography.

In FIG. 3, step 301 is implemented. Here, the portions that are not covered by the mask patterns 171 and 172 are anisotropically etched. The layer 160 is in particular etched on either side of the masks 171 and 172. The layer 160 is for example etched using fluorocarbon plasma, in an inductively coupled plasma (ICP) reactor. The etch is continued by etching the layer 140 on either side of the masks 171 and 172. The layer 140 is for example etched in an ICP reactor using fluorocarbon or HBr chemistry with continuous or pulsed plasma. The etching of the layer 140 stops at the nanostructure 110. The masks 171 and 172 are then removed. Gate stacks 143 and 144 are thus obtained, these including a control gate 141 surmounted by a hardmask 161, and a control gate 142 surmounted by a hardmask 162. The etching of the groove 12 between the masks 171 and 172 results in the formation of a gap 15 between the gate stacks 143 and 144. The nanostructure 110 is then exposed on either side of the gate stacks 143 and 144, and in particular at the bottom of the gap 15 made between these gate stacks 143 and 144.

In FIG. 4, step 302 is implemented following a process according to a first embodiment. Here, a step of partially thinning the link 115 is implemented. The link 115 is partially thinned while using the gate stacks 143 and 144 as masks. Thus, the thinned portion of the link 115 is self-aligned with the lateral faces of the gate stacks 143 and 144 so as to ensure good dimensional control of the link 115. In this way it is possible to guarantee a precise value for the tunnelling resistance of the link 115. Advantageously, the links 113 and 114 are also partially thinned. The links 113 to 115 of the nanostructure 110 are here partially thinned by oxidizing the exposed portions of this nanostructure 110. The nanostructure 110 is partially thinned so that the links 113 to 115 are thinner than the quantum dots 111 and 112. The nanostructure 110 is advantageously partially thinned so that the thickness of the thinned links 113 to 115 is between 2 and 5 nm, typically 3 nm. Such a thickness makes it possible in particular to implement a step of epitaxial deposition on a portion of the links 113 and 114. A link 115 thus thinned promotes coupling between the quantum dots 111 and 112 through tunnelling. The upper portion of the links 113 to 115 may for example be oxidized using $H_2/O_2$ plasma or $HBr/O_2$ plasma.

The oxidization of the upper portion of the links 113 to 115 simultaneously results in the formation of a layer of $SiO_2$ 119 on top of the thinned links 113 to 115. The formation of such a dielectric layer 119 during the thinning of the links 113 to 115 promotes a high-quality interface between these links and the layer 119, thereby limiting interference for the qubits of the quantum dots 111 and 112.

In FIG. 5, step 303 is implemented. Here, a dielectric layer 13 is conformally deposited, in particular on either side of the gate stacks 143 and 144. The dielectric of the layer 13 is different from that of the layer 119. The layer 13 is for example made of SiN or made of a material exhibiting a dielectric constant that is at most equal to 6. The layer 13 is deposited so as to fill the gap 15 above the thinned layer 115. The layer 13 then covers the gate stacks 143 and 144. The presence of the dielectric layer 13, in particular in the gap 15, allows the link 115 to be protected during the following technical steps.

In FIG. 6, step 304 is implemented. A partial etch is carried out to retain a portion of the layer 13 on either side of the gate stacks 143 and 144 (and in particular in the gap 15) and to expose the links 113 and 114 at the ends of the nanostructure 110 (or vertical faces of the nanostructure 110 for the configuration of FIG. 1). The layer 13 is for example partially etched by anisotropic plasma etching in an inductively coupled plasma (ICP) reactor. A spacer 135 is thus obtained between the gate stacks 143 and 144 and above the link 115. Additionally, a spacer 133 is obtained above the link 113 and a spacer 134 is obtained above the link 114. The partial etch thus makes it possible to expose ends of the nanostructure while retaining protection for its median portion through the residual layer 13.

In FIG. 7, step 305 is advantageously implemented. Semiconductor deposits 151 and 152 are formed on top of respective ends of the nanostructure 110. The semiconductor deposits 151 and 152 are thus self-aligned with the spacers 133 and 134. The semiconductor deposits 151 and 152 are here formed by epitaxy on exposed zones of the links 113 and 114. The deposits 151 and 152 then form carrier reservoirs at the ends of the nanostructure 110. The deposits 151 and 152 make contact, through tunnelling, with the quantum dots 111 and 112, respectively, via the links 113 and 114, respectively. A step of chemical-mechanical polishing or a step of selective etching may then be implemented in order to obtain the configuration illustrated in FIG. 1.

A process for fabricating the circuit 1 may be implemented according to a second embodiment. The process according to the second embodiment may be implemented starting from the configuration illustrated in FIG. 3, after having implemented for example steps 300 and 301.

Here, in FIG. 9, a step of partially thinning the link 115 is implemented. The link 115 is here thinned by etching. The etch may for example be carried out under the same conditions as in step 301, by excavating the link 115. The links 113 and 114 are here also thinned. Voids 103, 104 and 105 are thus formed in the upper portions of the links 113, 114 and 115, respectively. The nanostructure 110 is thus partially thinned so that the links 113 to 115 are thinner than the quantum dots 111 and 112. The nanostructure 110 is advantageously partially thinned so that the thickness of the thinned links 113 to 115 is between 2 and 5 nm, typically 3 nm.

In FIG. 10, a dielectric layer 119 is here deposited by conformal deposition. The dielectric layer 119 covers the link 115. The dielectric layer 119 here also covers the links 113 and 114. The dielectric layer 119 is for example made of $SiO_2$. The dielectric layer 119 is for example deposited with a thickness that is equivalent to the depth of the partial thinning carried out on the link 115.

In FIG. 11, a dielectric layer 13 is here deposited by conformal deposition. The dielectric of the layer 13 is different from that of the layer 119. The layer 13 is for example made of SiN or made of a material exhibiting a dielectric constant that is at most equal to 6. The layer 13 is deposited so as to fill the gap 15. The layer 13 covers the layer 119 and the gate stacks 143 and 144.

In FIG. 12, an etch is carried out to retain a portion of the layer 13 on either side of the gate stacks 143 and 144 (and in particular in the gap 15) and to expose the links 113 and 114 at the ends of the nanostructure 110. The etch is thus continued through the layer 119 to expose a portion of the links 113 and 114 at the ends of the nanostructure 110. The layer 13 is for example partially etched by anisotropic plasma etching in an ICP reactor. A spacer 135 is thus obtained between the gate stacks 143 and 144 and above the link 115. Additionally, a spacer 133 is obtained above the link 113 and a spacer 134 is obtained above the link 114.

In FIG. 13, semiconductor deposits 151 and 152 are formed on top of respective ends of the nanostructure 110. The semiconductor deposits 151 and 152 are here formed by epitaxy on exposed zones of the links 113 and 114. The deposits 151 and 152 then form carrier reservoirs at the ends of the nanostructure 110. The deposits 151 and 152 make contact, through tunnelling, with the quantum dots 111 and 112, respectively, via the links 113 and 114, respectively. A step of chemical-mechanical polishing or a step of selective etching may then be implemented in order to obtain the configuration illustrated in FIG. 1.

A process for fabricating the circuit 1 may be implemented according to a third embodiment. The process according to the third embodiment may be implemented starting from the configuration illustrated in FIG. 9, after having implemented the corresponding steps of the fabrication process according to the second embodiment.

In FIG. 14, a dielectric layer 119 is here deposited by wafer-scale conformal deposition. The layer 119 may for example be deposited by spin-coating. The dielectric layer 119 is for example made of $SiO_2$. The dielectric layer 119 fills in particular the gap 15. A step of chemical-mechanical polishing may then be implemented in order to obtain the configuration illustrated in FIG. 14.

In FIG. 15, an etch is carried out to retain a portion of the layer 119 on either side of the gate stacks 143 and 144 (and in particular in the gap 15). The etch is thus implemented to free the gap 15 but also such that this layer 119 still covers both the link 15 and the links 113 and 114. Such an etch may for example be implemented using HF (typically with etch-time control) or a mixture of $NH_3$ and $NF_3$ (typically with control by cycle). Such chemistries are in particular selective with respect to layers formed of SiN or of Si. Such an etch may for example be implemented to retain a thickness for the layer 119 of between 2 and 5 nm, and typically of 3 nm.

The process according to the third embodiment may then continue with carrying out the steps of the process, described with reference to FIGS. 5 to 7, of the first embodiment.

The invention has been illustrated using a nanostructure in the form of a nanowire. However, it is also possible to envisage applying the invention to a nanostructure in the form of a nanolayer.

The invention has been illustrated with reference to a silicon-on-insulator substrate but it could also be applied to a bulk substrate.

The invention has been illustrated with reference to an example including two coupled quantum dots. The invention also applies to a circuit featuring further quantum dots.

The invention claimed is:

1. A process for fabricating an electronic component with multiple quantum dots, comprising:
    providing a stack including a substrate, a nanostructure made of semiconductor material superposed over the substrate, the nanostructure including first and second quantum dots and a link linking the first and the second quantum dots, first and second control gate stacks being arranged on the first and the second quantum dots, the first and the second control gate stacks being separated by a gap, the first and the second quantum dots and the link exhibiting a same thickness;
    partially thinning the link while using the first and the second control gate stacks as masks so as to obtain the link, a thickness of which is less than that of the first and the second quantum dots;
    conformally forming a dielectric layer on either side of the first and the second control gate stacks so as to fill the gap above the partially thinned link;
    partially etching the dielectric layer so as to retain a portion of the dielectric layer on either side of the first and the second control gate stacks and in the gap, and so as to expose first and second links at respective first and second ends of the nanostructure, each of the first and second links respectively linking to the first and the second quantum dots; and
    forming first and second carrier reservoirs on either side of the retained portion of the dielectric layer, in contact with the first and the second ends of the nanostructure.

2. The process according to claim 1, wherein the provided stack comprises a buried dielectric layer interposed between the substrate and the nanostructure.

3. The process according to claim 1, wherein the nanostructure of the provided stack is a nanolayer or a nanowire.

4. The process according to claim 1, wherein the semiconductor material is not intentionally doped.

5. The process according to claim 1, wherein the step of partially thinning comprises a step of forming a second dielectric layer on top of the link by oxidizing an upper portion of the link.

6. The process according to claim 1, wherein the step of partially thinning includes an etching operation.

7. The process according to claim 6, wherein the step of partially thinning includes an anisotropic etching operation.

8. The process according to claim 1, wherein the formed first carrier reservoir makes contact, through tunneling via the first link, with the first quantum dot.

9. The process according to claim 8, wherein the step of forming the first carrier reservoir comprises an operation of epitaxially depositing semiconductor material on top of the respective ends of the nanostructure.

10. The process according to claim 8, wherein the step of partially thinning comprises an operation of partially thinning the first link such that the link and the first link exhibit a same thickness.

11. The process according to claim 1, wherein a width of the gap between the first and the second quantum dots is between 20 nm and 120 nm.

12. The process according to claim 1, wherein a thickness of the partially thinned link is between 2 nm and 10 nm.

13. The process according to claim 1, wherein the step of partially thinning is carried out so as to keep the first and the second quantum dots vertically aligned with the first and the second control gate stacks.

14. An electronic component with multiple quantum dots, comprising:
    a substrate;
    a nanostructure made of semiconductor material superposed over the substrate and including first and second quantum dots and a link linking the first and the second quantum dots;
    first and second control gate stacks arranged on the first and the second quantum dots and being separated by a gap, a thickness of the link being less than that of the first and the second quantum dots, the first and the second quantum clots being vertically aligned with the first and the second control gate stacks;
    a dielectric layer arranged on either side of the first and the second control gate stacks and filling the gap so as to form first and second links at respective first and second ends of the nanostructure, the first and second links respectively linking to the first and the second quantum dots; and
    first and second carrier reservoirs disposed on either side of the dielectric layer, in contact with first and second ends of the nanostructure.

15. The electronic component according to claim 14, wherein the dielectric layer does not cover the first and the second ends of the nanostructure, the first and the second carrier reservoirs being positioned on top of the first and the second ends of the nanostructure.

16. The electronic component according to claim 14, wherein the dielectric layer filling the gap is obtained by conformally depositing dielectric material.

* * * * *

UNITED STATES PATENT AND TRADEMARK OFFICE
CERTIFICATE OF CORRECTION

| | |
|---|---|
| PATENT NO. | : 11,362,181 B2 |
| APPLICATION NO. | : 16/699384 |
| DATED | : June 14, 2022 |
| INVENTOR(S) | : Nicolas Posseme et al. |

It is certified that error appears in the above-identified patent and that said Letters Patent is hereby corrected as shown below:

In the Claims

In Column 8, Claim 14, Line 36, delete "clots" and insert -- dots --, therefor.

Signed and Sealed this
Tenth Day of January, 2023

Katherine Kelly Vidal
*Director of the United States Patent and Trademark Office*